United States Patent [19]

Swanson et al.

[11] 4,426,767

[45] Jan. 24, 1984

[54] SELECTIVE EPITAXIAL ETCH PLANAR PROCESSING FOR GALLIUM ARSENIDE SEMICONDUCTORS

[75] Inventors: Alan W. Swanson, Marlboro; Charles R. Snider, Southborough; Frank H. Spooner, Concord, all of Mass.

[73] Assignee: Sperry Corporation, New York, N.Y.

[21] Appl. No.: 338,204

[22] Filed: Jan. 11, 1982

[51] Int. Cl.³ .................... H01L 21/20; H01L 21/302
[52] U.S. Cl. .................................... 29/571; 29/576 E; 29/578; 29/580; 148/1.5; 148/175; 156/648; 156/662; 427/84; 357/15; 357/22; 357/91
[58] Field of Search ............... 29/571, 576 E, 578, 29/580; 148/1.5, 175; 427/84; 156/648, 653, 655, 656, 657, 662; 357/15, 22, 91, 15 P, 22 PS

[56] References Cited

U.S. PATENT DOCUMENTS

| | | | |
|---|---|---|---|
| 3,609,477 | 9/1971 | Drangeid et al. | 357/22 X |
| 3,912,546 | 10/1975 | Hunsperger | 357/22 X |
| 4,053,350 | 10/1977 | Olsen et al. | 148/175 X |
| 4,092,660 | 5/1978 | Blocker | 357/22 |
| 4,111,725 | 9/1978 | Cho et al. | 29/571 X |
| 4,163,984 | 8/1979 | Pucel | 357/22 |
| 4,265,934 | 5/1981 | Ladd | 148/175 X |
| 4,317,686 | 3/1982 | Anand | 29/571 X |

OTHER PUBLICATIONS

Fukuta et al., "Power GaAs MESFET . . .", IEEE Trans. on Microwave Theory & Tech. vol. MTT-24, No. 6, Jun. 1976, pp. 312-317.
Suzuki et al., "GaAs Power FET" Fujitsu Sci. & Tech. J. (Japan) vol. 12, No. 2, Jun. 1976, pp. 163-177.
Tietjen et al., "Preparation & Properties . . . Vapor-Deposited GaAsP . . ." J. Electrohem. Soc., vol. 113, No. 7, Jul. 1966, pp. 724-728.

Primary Examiner—W. G. Saba
Attorney, Agent, or Firm—Howard P. Terry

[57] ABSTRACT

A method of fabricating gallium arsenide circuits or devices in which source and drain contact areas are deposited using vapor phase epitaxy techniques through holes in a refractory mask. Selected areas of a refractory mask are etched away to expose a region of active gallium arsenide material in which holes are formed by a chemical or plasma etch. These holes are then filled with highly doped vapor phase epitaxially grown gallium arsenide to provide drain and source contact regions. In further steps additional regions of the refractory mask are etched away to define gate regions. Metallization and lift-off may then occur in a single step to provide contacts to gate, drain and source regions and a planar surface for further device processing.

11 Claims, 4 Drawing Figures

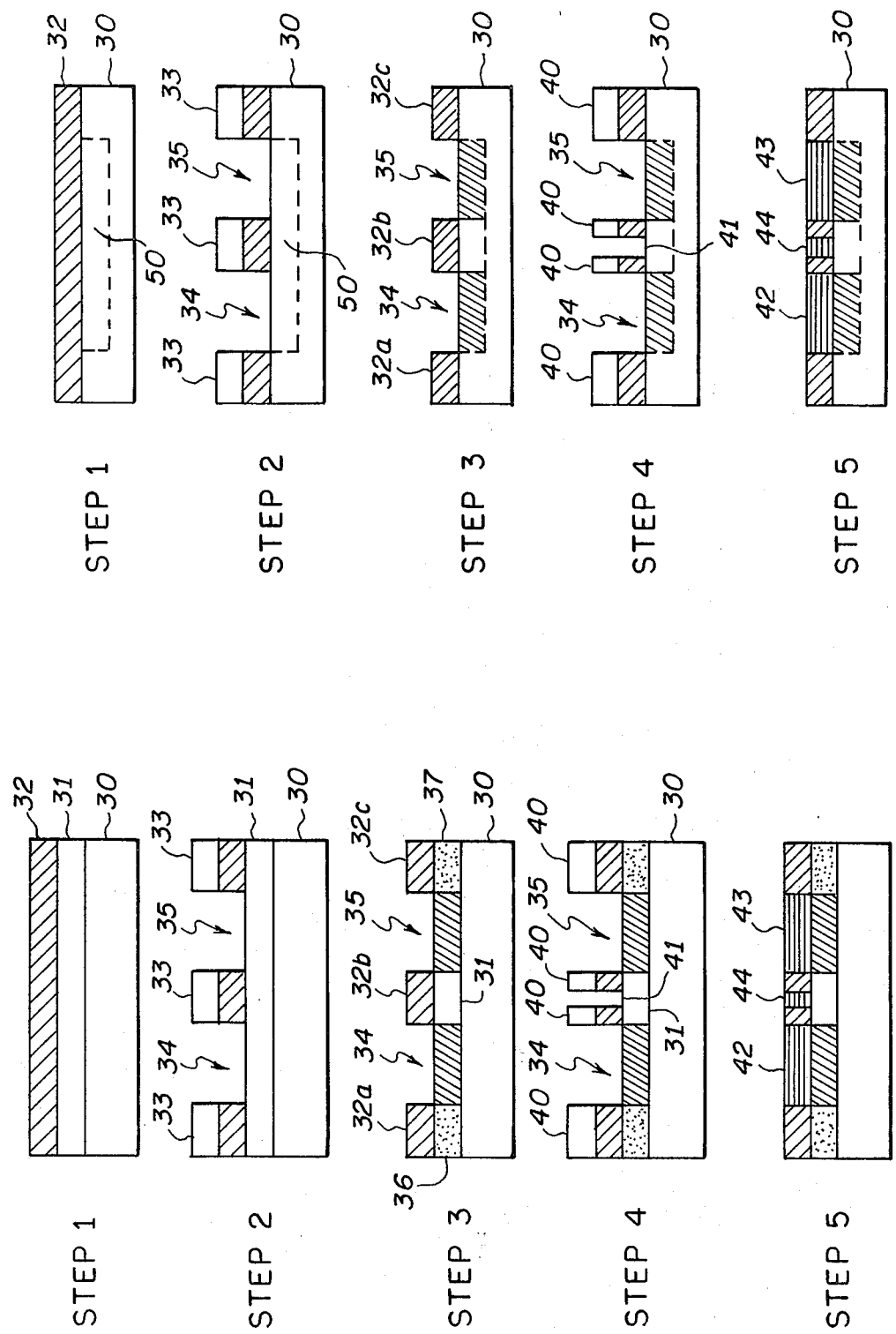

SELECTIVE EPITAXIAL ETCH PLANAR PROCESSING FOR GALLIUM ARSENIDE SEMICONDUCTORS

BACKGROUND OF THE INVENTION

1. Field of the Invention

The subject invention pertains to the field of gallium arsenide semiconductors and more particularly to a method for fabricating gallium arsenide circuits or devices using vapor phase epitaxy.

2. Description of the Prior Art

In the fabrication of semiconductor devices on semi-insulating gallium arsenide (GaAs) substrates, it is necessary to selectively include active regions on the semi-insulating substrate. One method for doing so, known in the art, utilizes ion implantation of the appropriate donor or acceptor species into the gallium arsenide substrate. The ion implanted areas are then activated by a post implant, high temperature annealing process. The annealing process takes place at a temperature of 800° to 900° C. for a period of 15 to 30 minutes. Since the semi-insulating substrates often contain defects in the form of dislocations in the crystalline lattice, the implanted substrates are subjected to a preselection procedure. The rejection rate of such substrates may be as high as 70 percent.

Furthermore, the depth of an active area formed by ion beam implantation using current techniques is limited to approximately 0.5 microns, which is inadequate for many devices. Additionally, the degree of doping available with ion beam implantation is limited to the range of $10^{17}$ to $10^{18}$ e−/cm$^3$. Metallization of such areas will not result in ohmic contacts without resort to high temperature alloying techniques.

In another method of active area formation known in the art as molecular beam epitaxy (MBE), doped gallium arsenide may be grown on a semi-insulating substrate through a mask. Molecular beam epitaxy, however, has the disadvantage of permitting substantial lateral growth as well as growth in a desired area of the substrate. In molecular beam epitaxy crystals will nucleate on the mask forming a polycrystalline deposit in addition to the desired growth on the substrate where single crystal deposits will be formed. The polycrystalline material formed on the mask may be interfere with further processing steps and hinder device performance.

The present invention provides a method for fabricating gallium arsenide semiconductors having the high carrier mobility and low dislocation density that vapor phase epitaxial (VPE) gallium arsenide offers along with the excellent isolation available from chromium doped gallium arsenide, pure undoped gallium arsenide, or other suitable semi-insulating substrates. The method also permits the fabrication of ohmic contacts without the need to resort to a high temperature alloying step and the greater depth of active area that vapor phase epitaxially grown gallium arsenide can provide.

SUMMARY OF THE INVENTION

A method for fabricating semiconductor devices on gallium arsenide semi-insulating substrates embodying the principles of the present invention comprises disposing a region of active gallium arsenide material in intimate contact with a semi-insulating substrate. The region of active gallium arsenide material may be either ion implanted into the gallium arsenide substrate or deposited using epitaxial techniques onto the substrate. A refractory mask layer may then be deposited over the active gallium arsenide region, areas of which are then selectively removed to selectively expose active gallium aresenide regions. The exposed regions of the active gallium arsenide are subjected to an etching process in which holes corresponding to the exposed areas are etched in the active gallium arsenide material. The holes may then be filled with vapor phase epitaxially grown gallium arsenide of a predetermined doping to form drain and source contact regions. The refractory mask is then further etched to expose selected areas of the active gallium arsenide region to form the gate region. A layer of metal may then be applied to the drain, source and gate contact regions. If necessary, these layers of metals may then be alloyed to the active gallium arsenide areas.

BRIEF DESCRIPTION OF THE DRAWINGS

FIG. 3 shows an embodiment of the present invention.

FIG. 4 shows an embodiment of the present invention.

DESCRIPTION OF THE PREFERRED EMBODIMENT

Figure 1:
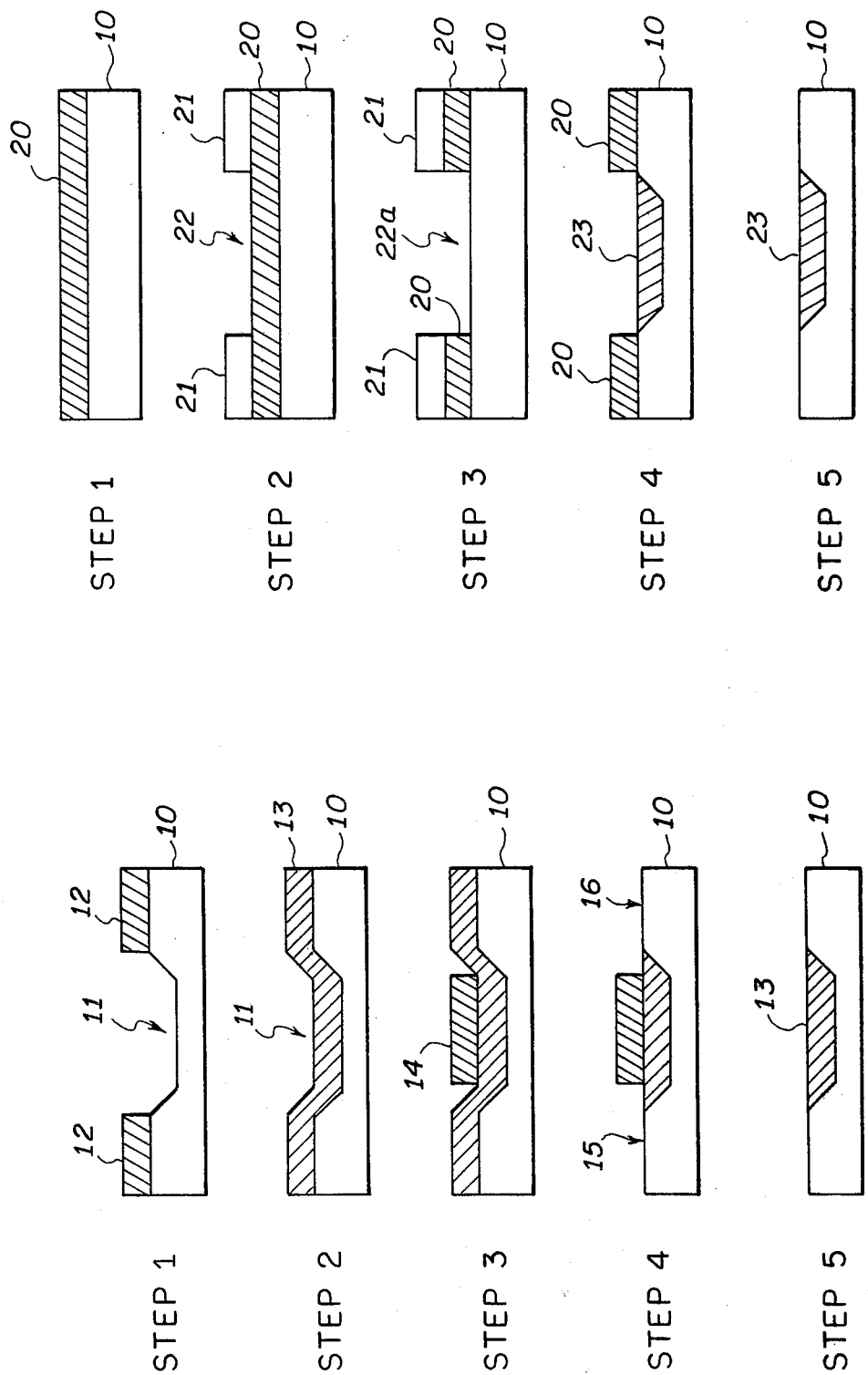
FIG. 1 shows a vapor phase epitaxial technique useful in the explanation of the present invention.

Referring to FIG. 1, Step 1, a semi-insulating substrate 10 may have a hole 11 etched into it by applying a layer of photoresist 12 which is patterned and developed exposing an area of the semi-insulating substrate 10, which is then etched using techniques known in the art. Depending on the etching technique utilized, the holes will have either vertical walls or the tapered walls shown. Semi-insulating substrate 10 typically has a resistivity on the order of $10^7$ Ω-cm and may be comprised of, for example, chromium-doped gallium arsenide. In Step 1 the holes may be chemically etched using an appropriate etchant, for example, a 3:1:50 mixture of phosphoric acid (H$_3$PO$_4$), hydrogen peroxide (H$_2$O$_2$) and water (H$_2$O). Referring to Step 2, the remaining photoresist 12 is stripped from substrate 10 and a VPE GaAs buffer and active layer 13 is grown over the surface and into the hole 11 as shown. In Step 3, a layer of photoresist is deposited over the VPE grown layer, exposed and developed to leave an area of photoresist 14 over the VPE layer 13 in hole 11. In Step 4 the VPE gallium arsenide not covered by photoresist 14 is etched away, thereby exposing semi-insulating gallium arsenide substrate regions 15 and 16. In Step 5 photoresist 14 is removed leaving a planar surface ready for further device or circuit fabrication.

Figure 2:
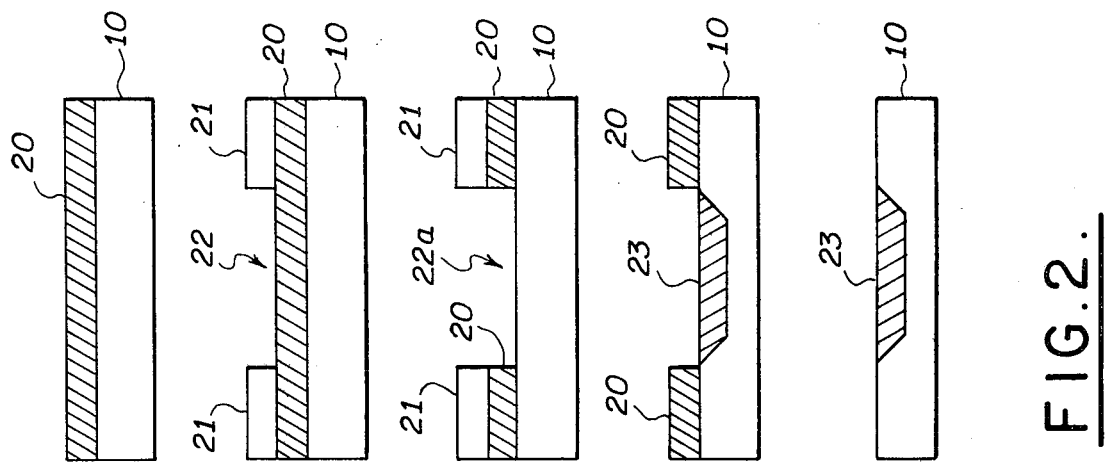
FIG. 2 shows a vapor phase epitaxial technique useful in the explanation of the present invention.

Refer now to FIG. 2. In Step 1 refractory mask layer 20 is deposited over semi-insulating gallium arsenide substrate 10. The mask layer may be of any material known in the art useful as a refractory mask such as silicon nitride (Si$_3$N$_4$), carbon, silicon dioxide (SiO$_2$) tantalum, tungsten, titanium or molybdenum. In Step 2 a layer of photoresist 21 is deposited on refractory mask 20, and exposed and developed using techniques well known in the art. Region 22 of refractory mask 20 is thus exposed for further processing in Step 3 in which it is subjected to a chemical or plasma etch to expose the semi-insulating gallium arsenide surface in region 22a.

The remaining photoresist 21 is then stripped away exposing the remaining refractory mask. In Step 4 holes are etched in the gallium arsenide semi-insulating substrate using techniques known in the art. The resulting holes are then filled with active gallium arsenide material 23 grown using vapor phase epitaxial techniques. No growth will occur on the mask 20 which, if silicon nitride or silicon dioxide, may be left in place for surface passivation to improve isolation between the various active areas.

The unprotected surface of gallium arsenide devices is susceptible to degeneration from further processing steps and environmental causes. Unlike silicon devices in which a protective layer of silicon dioxide may be easily grown to protect the substrate from further processing steps or the environment, gallium arsenide devices require other methods to stabilize the surface. A refractory mask of a suitable material such as silicon nitride or silicon dioxide can, however, effectively seal the surface and provide the needed protection.

Finally, in Step 5 the remaining refractory mask may be removed if surface passivation is not desired. In such instance a planar surface remains for further device or circuit fabrication. In the process illustrated in FIG. 2 both the etching of the holes and the growth of the VPE layers may be carried out sequentially in a VPE reactor at approximately 750° C.

In the embodiment of the invention shown in FIG. 3 a three mask level process for fabricating metal semiconductor field effect transistors (MESFET) structures is shown. In this process selective vapor phase epitaxy is used to grow highly doped ($10^{19}$ e−/cm$^3$) contact layers for the source and drain areas of the MESFET that is being fabricated. Metallization of these highly doped areas results in ohmic contacts without the necessity of the high temperature alloying step required for making ohmic contacts to gallium arsenide doped in the $10^{17}$ through $10^{18}$ e−/cm$^3$ range. Compared to ion implantation techniques there may thus be a savings in processing costs and an increase in device yield. Furthermore, it has been observed that MESFET devices fabricated using vapor phase epitaxy and non-alloyed metallization for the contacts have higher gate to drain breakdown voltages than alloyed devices.

Referring now to FIG. 3, a VPE active ayer 31 is grown on semi-insulating gallium arsenide substrate 30. A refractory mask 32 as described in FIG. 2 is deposited over the active gallium arsenide substrate. As previously described, the refractory mask may be comprised of silicon nitride, carbon, silicon dioxide, tantalum, tungsten, titanium or molybdenum. In Step 2 photoresist 33 is applied over the surface of refractory mask 32, exposed and developed to present a pattern in which regions 34 and 35 of active layer 31, which will become the source and drain areas respectively of the FET type device, are defined. The final procedure of Step 2 comprises stripping away the remaining photoresist 33. Holes are etched in the active layer 31 in Step 3, which holes are then filled with highly doped gallium arsenide grown in a VPE reactor in regions 34 and 35. The remaining areas of refractory mask 32, namely 32a, 32b and 32c may be retained for surface passivation.

Additionally, shown in Step 3 are implant damage areas 36 and 37 which are utilized where greater isolation is required between the various active areas of a gallium arsenide integrated circuit. Implant areas 36 and 37 minimize cross-talk between nearby active device areas. The isolation implants 36 and 37 may be accomplished with hydrogen ion implants. If implant areas 36 and 37 are required, they must be performed after all heating steps have been completed, otherwise damage done to the active layer by the hydrogen ion implant may be partially repaired during the annealing. The isolation implants are made after protecting all of essential active areas from damage with a masking layer of photoresist or other suitable masking material.

Referring now to Step 4, a second layer of photoresist 40 is applied and patterned to expose additional areas of the refractory mask, which may then be further etched to define the gate area 41. The photoresist is then stripped away and the device is ready for processing Step 5 which includes metallization and lift off of contact and gate areas. Metallization 42 and 43 form the source and drain contacts respectively whereas metallization 44 forms the gate contact. The metallization and lift off processes, well known in the art, include application of a third layer of photoresist which is patterned and developed to expose regions 34, 35 and 41. Metallization then occurs according to techniques known in the art such as, for example, evaporation, which is then followed by the dissolution of the remaining photoresist which will lift off with it any metallization which has been deposited onto the remaining photoresist. The resulting planar surface shown in Step 5 is then ready for second level metallization or further processing.

The final device shown in Step 5 is a planar device and has passivation on all non-metallized areas on the gallium arsenide surface. The gate metal at 44 desirably forms a Schottky diode since it is resting on a $10^{17}$ e−/cm$^3$ channel layer. In this figure the fewest number of steps needed to fabricate an FET structure is shown, assuming that a contact alloying step is not needed. If an alloying step is required for extremely low contact resistivity, then an additional mask level and another separate metallization and lift-off is required. Thus, the present invention saves several processing steps compared to processes in which the contact areas are formed on normally doped active regions followed by metallization and alloying.

Refer now to FIG. 4 in which an embodiment of the invention in shown in which the active device area is ion beam implanted as opposed to grown using VPE techniques as shown in FIG. 3. In this process highly doped contact areas are grown into the previously implanted channel layers. This process offers the advantages of good uniformity across the channel regions combined with the highly doped surface of the contact regions, thus allowing for devices with uniform control voltages and non-alloyed ohmic contacts.

In FIG. 4, Step 1 active device area 50 is implanted into semi-insulating substrate 30 using ion beam implantation of the desired type ion such as Si$^{30}$. Since active implant area 50 may be selectively formed on semi-insulating substrate 30, excellent isolation of device areas may be achieved without the need for the isolation implants shown in regions 36 and 37 in FIG. 3. Refractory mask 32 may then be deposited over a surface of the substrate and implant areas. In Step 2 photoresist layer 33 is patterned and developed to expose the refractory mask in selected regions. The refractory mask is then plasma or chemically etched in these regions down to the gallium arsenide surface to expose the gallium arsenide active surface in regions 34 and 35. Resist 33 is then removed.

In Step 3 holes are etched in the implant area in regions 34 and 35 and filled with highly doped gallium arsenide in a VPE reactor. The refractory mask layer may, if comprised of silicon nitride or silicon dioxide, be left for surface passivation as shown by areas 32a, 32b and 32c. The activation anneal of the ion implanted active area will take place in the VPE reactor along with the VPE growth, thus saving a processing step. Otherwise, the activation would need to be performed as an additional procedure of Step 1.

Referring now to Step 4, an additional layer of photoresist 40 is applied to the exposed surface, patterned and developed to define gate area 41 and the source and drain areas in regions 34 and 35, respectively. The development of the photoresist would be followed by etching to remove the refractory mask from region 41. The photoresist may then be removed to expose the contact areas in regions 34 and 35 and the gate area 41 for further processing in Step 5. Step 5 in FIG. 4 comprises a metallization and lift off as described previously for Step 5 in FIG. 3, resulting in the deposit of metal contacts in regions 34 and 35 and gate area 41. These metal contacts 42, 43, and 44 will form contacts for the source, drain and gate respectively. As described for FIG. 3, Step 5, a planar surface will remain for a second level metallization and further processing, if needed.

As described for FIG. 3, the final device shown in Step 5 is a planar device and will similarly have passivation on all non-metallized areas of the gallium arsenide surface. The gate metal at 44 forms a Schottky diode with the gate area since it is resting on a $10^{17}e^-/cm^3$ channel layer. Once again, since the alloying step should not be required, additonal mask levels and separate metallizations and liftoffs may be dispensed with.

While the invention has been described in its preferred embodiments, it is to be understood that the words which have been used are words of description rather than limitation and that changes may be made within the purview of the appended claims without departing from the true scope and spirit of the invention in its broader aspects.

We claim:

1. A method for fabricating semiconductor devices on gallium arsenide semi-insulating substrates comprising the steps of:
disposing a region of active gallium arsenide material in contact with said semi-insulating substrate;
depositing a refractory mask layer over said active gallium arsenide and said substrate;
selectively removing regions of said refractory mask to expose said active gallium arsenide region;
etching first and second sets of holes in said exposed active gallium arsenide region;
filling said first and second set of holes with vapor phase epitaxially grown gallium arsenide having a doping level of $10^{19}e/cm^3$ thereby forming first and second contact regions;
selectively etching said refractory mask to expose selected areas of said active gallium arsenide disposed between said first and second contact regions and thereby defining third regions; and
metallizing said first, second and third regions thereby forming ohmic contacts in said first and second regions.

2. The method according to claim 1 wherein said step of disposing a region of active gallium arsenide material comprises vapor phase epitaxial growth of doped gallium arsenide material on said semi-insulating gallium arsenide surface.

3. The method according to claim 1 wherein said step of disposing a region of active gallium arsenide material comprises the step of ion beam implanting selected areas of said semi-insulating substrate with predetermined donor material.

4. The method according to claim 2 or 3 wherein said refractory mask layer is comprised of silicon nitride.

5. The method according to claim 2 wherein said refractory mask is comprised of material selected from the group consisting of tantalum, tungsten, titanium and molybdenum.

6. The method according to claim 2 further comprising the step of implanting said gallium arsenide active region with H+ ions selected to isolate said first, second and third regions.

7. The method according to claim 2 wherein said predetermined doping of said vapor phase epitaxially grown gallium arsenide is derived from silane gas.

8. The method according to claims 2 or 3 wherein said first, second and third regions, comprise drain, source and gate respectively.

9. The method according to claim 3 wherein said predetermined donor material comprises Si+.

10. The method according to claim 3 or 9 further comprising the step of activation annealing said active implant.

11. The method according to claim 10 wherein said activation anneal occurs during said filling of said holes during said vapor phase epitaxy.

* * * * *